United States Patent
Kim et al.

(10) Patent No.: US 9,793,501 B2
(45) Date of Patent: Oct. 17, 2017

(54) ORGANIC LIGHT EMITTING DIODE DISPLAY

(71) Applicant: SAMSUNG DISPLAY CO., LTD., Yongin. Gyeonggi-Do (KR)

(72) Inventors: Min-Sung Kim, Hwaseong-si (KR); Thanh Tien Nguyen, Seoul (KR); Eun Young Lee, Seoul (KR); Ki Ju Im, Suwon-si (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/722,572

(22) Filed: May 27, 2015

(65) Prior Publication Data
US 2016/0148984 A1    May 26, 2016

(30) Foreign Application Priority Data

Nov. 24, 2014    (KR) .................. 10-2014-0164741

(51) Int. Cl.
*H01L 51/00*    (2006.01)
*H01L 51/52*    (2006.01)
*H01L 27/32*    (2006.01)

(52) U.S. Cl.
CPC ...... *H01L 51/0097* (2013.01); *H01L 27/3244* (2013.01); *H01L 51/5253* (2013.01); *H01L 2251/5338* (2013.01); *Y02E 10/549* (2013.01)

(58) Field of Classification Search
CPC combination set(s) only.
See application file for complete search history.

(56) References Cited

U.S. PATENT DOCUMENTS

| | | | |
|---|---|---|---|
| 8,237,165 B2 | 8/2012 | Kim et al. | |
| 2008/0128683 A1* | 6/2008 | Kim | H01L 51/5246 257/40 |
| 2009/0066232 A1* | 3/2009 | Koo | H01L 51/5246 313/504 |
| 2010/0295812 A1* | 11/2010 | Burns | G06F 3/0412 345/174 |
| 2010/0315353 A1* | 12/2010 | Huang | G06F 3/041 345/173 |
| 2012/0241811 A1* | 9/2012 | Kim | H01L 51/5253 257/100 |
| 2013/0200422 A1* | 8/2013 | Chung | H01L 51/5256 257/99 |
| 2015/0144909 A1* | 5/2015 | Byun | H01L 51/5253 257/40 |

FOREIGN PATENT DOCUMENTS

| | | |
|---|---|---|
| JP | 4905780 | 1/2012 |
| KR | 10-2011-0106539 A | 9/2011 |
| KR | 10-1155907 | 6/2012 |

* cited by examiner

*Primary Examiner* — Kyoung Lee
*Assistant Examiner* — Ratisha Mehta
(74) *Attorney, Agent, or Firm* — Lee & Morse, P.C.

(57) ABSTRACT

An organic light emitting diode display includes a flexible substrate, a driving layer positioned on the flexible substrate and including a thin film transistor, an element layer positioned on the driving layer and including an organic light emitting diode that is connected to the thin film transistor, a thin film encapsulation layer covering the element layer and encapsulating the element layer and the flexible substrate, and a compensation layer positioned between the element layer and the flexible substrate.

8 Claims, 7 Drawing Sheets

ORGANIC LIGHT EMITTING DIODE DISPLAY

CROSS-REFERENCE TO RELATED APPLICATION

Korean Patent Application No. 10-2014-0164741, filed on Nov. 24, 2014, in the Korean Intellectual Property Office, and entitled: "Organic Light Emitting Diode Display," is incorporated by reference herein in its entirety.

BACKGROUND

1. Field

Embodiments relate to an organic light emitting diode display, and more particularly, to a flexible organic light emitting diode display.

2. Description of the Related Art

A flat panel display may be an organic light emitting diode display, a liquid crystal display, a plasma display panel, or the like.

An organic light emitting diode display includes a substrate, an organic light emitting diode positioned on the substrate and an encapsulation, which covers the organic light emitting diode to encapsulate the organic light emitting diode along with the substrate.

SUMMARY

Embodiments are directed to an organic light emitting diode display including a flexible substrate, a driving layer positioned on the flexible substrate and including a thin film transistor, an element layer positioned on the driving layer and including an organic light emitting diode that is connected to the thin film transistor, a thin film encapsulation layer covering the element layer and encapsulating the element layer along with the flexible substrate, and a compensation layer positioned between the element layer and the flexible substrate.

The compensation layer may include a viscoelastic material.

When a bending moment is generated in the organic light emitting diode display, a first neutral plane may be formed between the thin film encapsulation layer and the compensation layer, and a second neutral plane is formed between the compensation layer and the flexible substrate.

The compensation layer may be positioned between the element layer and the driving layer and may contact the element layer and the driving layer, respectively.

The compensation layer may be positioned between the driving layer and the flexible substrate and may contact the driving layer and the flexible substrate, respectively.

When a bending moment is generated in the organic light emitting diode display, an interface between the element layer and the thin film encapsulation layer may be formed as a neutral plane.

The flexible substrate includes may include a substrate main body part including a polymer and a buffer layer positioned on the substrate main body part.

An edge of the thin film encapsulation layer may contact the flexible substrate. The edge of the thin film encapsulation layer and the flexible substrate may be bonded to each other by laser bonding.

Embodiments are also directed to an organic light emitting diode display including a flexible substrate, a driving layer positioned on the flexible substrate and including a thin film transistor, an element layer positioned on the driving layer and including an organic light emitting diode that is connected to the thin film transistor, and a thin film encapsulation layer covering the element layer and encapsulating the element layer along with the flexible substrate. When a bending moment is generated in the organic light emitting diode display, an interface between the element layer and the thin film encapsulation layer may be formed as a neutral plane.

The organic light emitting diode display may further include a compensation layer positioned between the element layer and the flexible substrate.

The compensation layer may include a viscoelastic material.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

Hereinafter, an organic light emitting diode display according to an exemplary embodiment will be described with reference to FIGS. 1 to 2.

Figure 1:
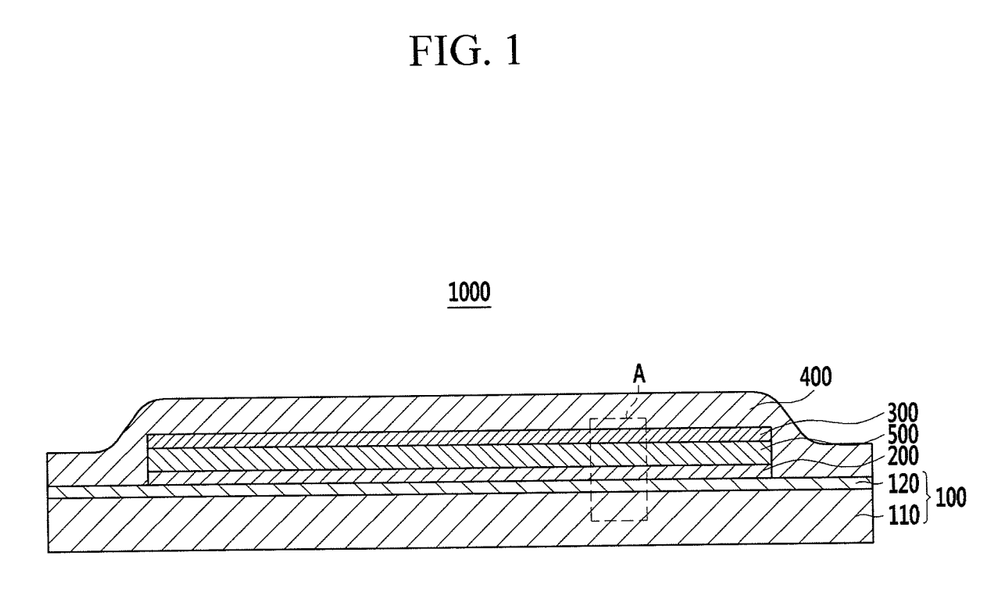
FIG. 1 illustrates a cross-sectional view depicting an organic light emitting diode display according to an exemplary embodiment.

FIG. 1 illustrates a cross-sectional view depicting an organic light emitting diode display according to an exemplary embodiment. FIG. 2 illustrates a cross-sectional view depicting portion A of FIG. 1 in detail.

Figure 2:
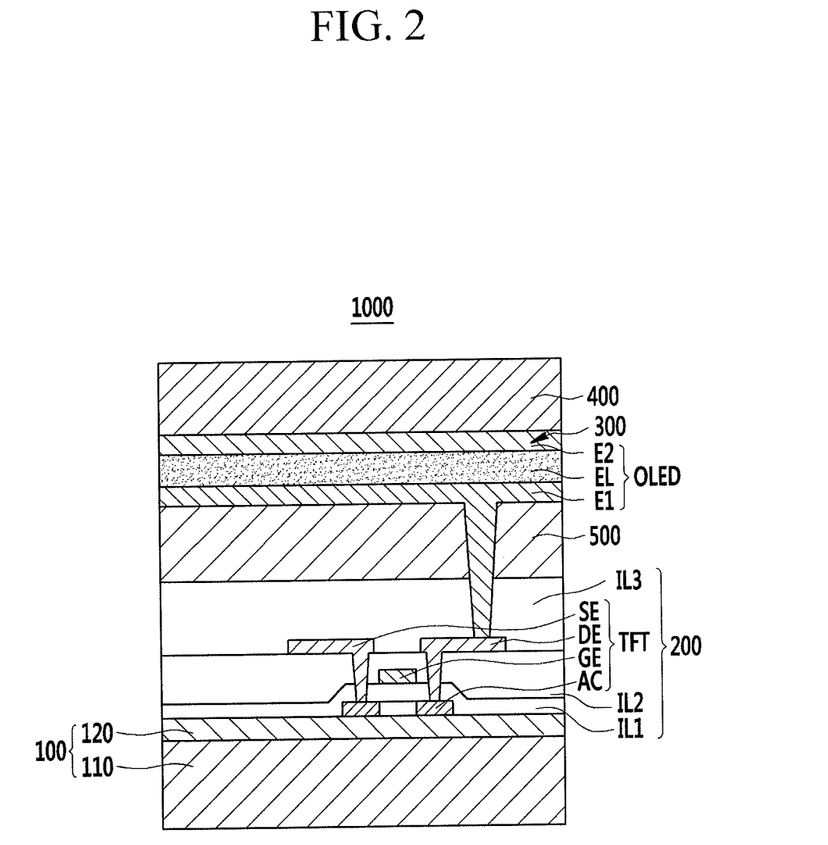
FIG. 2 illustrates a cross-sectional view depicting portion A of FIG. 1 in detail.

As illustrated in FIGS. 1 and 2, an organic light emitting diode display 1000 according to an exemplary embodiment may be flexible, stretchable, foldable, bendable, and rollable. the organic light emitting diode display 1000 may include a flexible substrate 100, a driving layer 200, an element layer 300, a thin film encapsulation layer 400, and a compensation layer 500.

The flexible substrate 100 may be flexible, stretchable, foldable, bendable, or rollable. As a result, the entire organic light emitting diode display 1000 may be flexible, stretchable, foldable, bendable, or rollable. For example, the flexible substrate 100 may have a form of a flexible film including a resin such as polyimide.

The flexible substrate 100 may include a substrate main body part 110 and a buffer layer 120 that is positioned on the substrate main body part 110.

The substrate main body part 110 may be an insulating substrate including glass, polymer, stainless steel, or the like.

The buffer layer 120 may help prevent undesirable external substances, such as moisture passing through the substrate main body part 110, from penetrating into the element layer 300. The buffer layer 120 may be a laminate including at least one of an organic layer and an inorganic layer.

The driving layer 200 may be positioned on the flexible substrate 100 and may include a thin film transistor (TFT).

The thin film transistor (TFT) may include an active layer (AC), a gate electrode (GE), a source electrode (SE), and a drain electrode (DE). A first insulating layer IL1 may be positioned between the gate electrode GE and the active layer AC. A second insulating layer IL2 may be positioned between the gate electrode GE and the source electrode SE. The source electrode SE and the drain electrode DE may be covered with a third insulating layer IL3. The drain electrode DE of the thin film transistor (TFT) may be connected to a first electrode E1 of the organic light emitting diode (OLED) of the element layer 300. The first insulating layer IL1, the second insulating layer IL2, and the third insulating layer IL3 may each be a laminate including at least any one of an inorganic layer and an organic layer.

The active layer AC may be formed of a poly-silicon or oxide semiconductor. The oxide semiconductor may include any one of an oxide of titanium (Ti), hafnium (Hf), zirconium (Zr), aluminum (Al), tantalum (Ta), germanium (Ge), zinc (Zn), gallium (Ga), tin (Sn), or indium (In), and a zinc oxide (ZnO), an indium-gallium-zinc oxide (InGaZnO4), an indium-zinc oxide (Zn1'In—O), a zinc-tin oxide (Zn—Sn—O), an indium-gallium oxide (In—Ga—O), an indium-tin oxide (In—Sn—O), an indium-zirconium oxide (In—Zr—O), an indium-zirconium-zinc oxide (In—Zr—Zn—O), an indium-zirconium-tin oxide (In—Zr—Sn—O), an indium-zirconium-gallium oxide (In—Zr—Ga—O), an indium-aluminum oxide (In—Al—O), an indium-zinc-aluminum oxide (In—Zn—Al—O), an indium-tin-aluminum oxide (In—Sn—Al—O), an indium-aluminum-gallium oxide (In—Al—Ga—O), an indium-tantalum oxide (In—Ta—O), an indium-tantalum-zinc oxide (In—Ta—Zn—O), an indium-tantalum-tin oxide (In—Ta—Sn—O), an indium-tantalum-gallium oxide (In—Ta—Ga—O), an indium-germanium oxide (In—Ge—O), an indium-germanium-zinc oxide (In—Ge—Zn—O), an indium-germanium-tin oxide (In—Ge—Sn—O), an indium-germanium-gallium oxide (In—Ge—Ga—O), a titanium-indium-zinc oxide (Ti—In—Zn—O), and a hafnium-indium-zinc oxide (Hf—In—Zn—O), which are composite oxides thereof. The active layer AC may include a channel region that is not doped with impurities and a source region and a drain region that are doped with impurities, the source region and drain region being formed at respective sides of the channel region. These impurities may be selected depending on a kind of thin film transistor and N-type or P-type impurities. In the case where the active layer AC is formed of the oxide semiconductor, a separate protecting layer may be added in order to protect the oxide semiconductor, which may be vulnerable to an external environment such as exposure to a high temperature, or the like.

According to the exemplary embodiment, the driving layer 200 may include the thin film transistor (TFT). The driving layer 200 may include at least one scan wiring, at least one data wiring, a plurality of thin film transistors, and at least one capacitor.

The element layer 300 may be positioned on the driving layer 200. The element layer 300 may include an organic light emitting diode (OLED) that is connected to the thin film transistor (TFT).

The organic light emitting diode (OLED) may include the first electrode E1 connected to the drain electrode DE of the thin film transistor (TFT), an organic emission layer (EL) positioned on the first electrode E1, and a second electrode E2 positioned on the organic emission layer EL.

The first electrode E1 may be an anode, which is a hole injection electrode. The first electrode E1 may be any one of a light reflective electrode, a light transflective electrode, and a light transmitting electrode. In other implementations, the first electrode E1 may be a cathode, which is an electron injection electrode.

The organic emission layer (EL) may be positioned on the first electrode E1. The organic emission layer EL may be formed of a low molecular organic material or a high molecular organic material such as poly 3,4-ethylenedioxythiophene (PEDOT), or the like. The organic emission layer EL may include a red organic emission layer emitting red light, a green organic emission layer emitting green light, and a blue organic emission layer emitting blue light. The red organic emission layer, the green organic emission layer, and the blue organic emission layer may be formed in a red pixel, a green pixel, and a blue pixel, respectively, to implement a color image. The red organic emission layer, the green organic emission layer, and the blue organic emission layer may be stacked as the organic emission layer EL in all of the red pixel, the green pixel, and the blue pixel. A red color filter, a green color filter, and a blue color filter may be formed in each pixel, thereby making it possible to implement the color image. As another example, a white organic emission layer emitting white light may be formed as the organic emission layer EL in all of the red pixel, the green pixel, and the blue pixel and a red color filter, a green color filter, and a blue color filter may be formed in each pixel, thereby making it possible to implement the color image. In the case of implementing the color image using a white organic emission layer as the organic emission layer EL, and the color filter. deposition masks for depositing the red organic emission layer, the green organic emission layer, and the blue organic emission layer on the respective individual pixels, that is, the red pixel, the green pixel, and the blue pixel do not need to be used. The white organic emission layer, which is the organic emission layer EL described in another example, may be formed as one organic emission layer or may include a configuration in which a plurality of organic emission layers are stacked to emit white light. As an example, the organic emission layer EL may include a configuration in which at least one yellow organic emission layer and at least one blue organic emission layer are combined with each other to allow white light to be emitted, a configuration in which at least one cyan organic emission layer and at least one red organic emission layer are combined with each other to allow white light to be emitted, a configuration in which at least one magenta organic emission layer and at least one green organic emission layer are combined with each other to allow white light to be emitted, or the like.

The second electrode E2 may be positioned on the organic emission layer EL. The second electrode E2 may be a cathode, which is an electron injection electrode. The second electrode E2 may be any one of a light reflective electrode, a light transflective electrode, and a light transmitting electrode. The second electrode E2 may be positioned over the display area DA of the substrate SUB so as to cover the organic emission layer EL. In other implementations, the second electrode E2 may be an anode, which is a hole injection electrode.

The thin film encapsulation layer 400 may be positioned on the flexible substrate 100, having the element layer 300 therebetween. The thin film encapsulation layer 400 may encapsulate the element layer 300, along with the flexible substrate 100. The thin film encapsulation layer 400 may be positioned over the entire flexible substrate 100. The thin film encapsulation layer 400 may be formed as a thin film encapsulant. The thin film encapsulation layer 400 may include an organic layer or an inorganic layer. For example, the thin film encapsulation layer 400 may include at least one organic layer and at least one inorganic layer that are alternately stacked. The number of each of inorganic layers or organic layers may be plural, and the plurality of inorganic layers and the plurality of organic layers each may be alternately stacked. The thin film encapsulation layer 400 may include at least one sandwich structure in which at least one organic layer is present between at least two inorganic layers. The organic layer may be formed of polymer, and may be, for example, a single film or a stacked film formed of any one of polyethylene terephthalate, polyimide, polycarbonate, epoxy, polyethylene, and polyacrylate. For example, the organic layer may be formed of polyacrylate. The organic layer may include a polymerized monomer composition including a diacrylate based monomer and a triacrylate based monomer. The monomer composition may further include a monoacrylate based monomer. The monomer composition may further include a photo initiator such as TPO (diphenyl (2,4,6-trimethyl benzoyl)phosphine oxide). Further, the inorganic layer may be a single film or a stacked film including a metal oxide or a metal nitride. For example, the inorganic layer may include at least any one of $SiN_x$, $Al_2O_3$, $SiO_2$, and $TiO_2$).

The inorganic layer may be positioned on a top layer of the thin film encapsulation layer 400. The inorganic layer positioned on the top layer may be stacked, having an area greater than that of the organic layer, thereby covering an end of the organic layer.

The compensation layer 500 may be positioned between the element layer 300 and the flexible substrate 100, for example, between the element layer 300 and the driving layer 200. The compensation layer 500 may contact the element layer 300 and the driving layer 200, respectively. The compensation layer 500 may include at least one of an organic layer and an inorganic layer and may be formed as a laminate that is formed of a plurality of layers. The compensation layer 500 may have a varying thickness depending on Young's modulus of the compensation layer 500 itself. When a bending moment is generated in the organic light emitting diode display 1000, the compensation layer 500 may have various thicknesses depending on Young's modulus of a material forming the compensation layer 500 such that a neutral plane is formed at an interface between the thin film encapsulation layer 400 and the element layer 300. When the bending moment is applied to the organic light emitting diode display 1000, the compensation layer 500 may be configured to control a position of the neutral plane that is formed in the organic light emitting diode display 1000.

Figure 3:
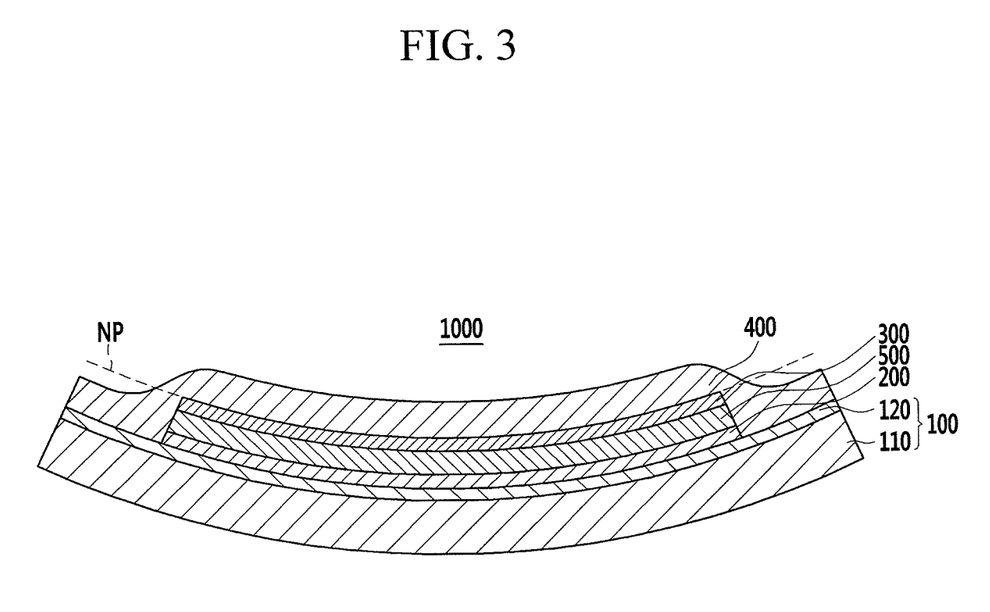
FIG. 3 illustrates a cross-sectional view depicting an example where a bending moment is generated in the organic light emitting diode display illustrated in FIG. 1.

FIG. 3 illustrates a cross-sectional view depicting an example where a bending moment is generated in the organic light emitting diode display illustrated in FIG. 1.

As illustrated in FIG. 3, when a bending moment is generated in the organic light emitting diode display 1000 according to the exemplary embodiment, a position of a neutral plane NP may be controlled by the compensation layer 500. Thus, the interface between the element layer 300 and the thin film encapsulation layer 400 may be formed as the neutral plane NP. A compression stress may be applied to an upper side of the neutral plane NP by the bending moment, and a tensile stress is applied to a lower side of the neutral plane NP.

When the interface between the element layer 300 and the thin film encapsulation layer 400 is formed as the neutral plane (NP), and thus, when the bending moment is generated in the organic light emitting diode display 1000, due to characteristics of the neutral plane (NP), the interface between the element layer 300 and the thin film encapsulation layer 400 is not increased or reduced and is bent while keeping an original length. As a result, even though a stress is repeatedly applied to the organic light emitting diode display 1000 or a stress beyond breaking strength is applied thereto, the thin film encapsulation layer 400 may be prevented from being peeled off from the element layer 300. The flexible organic light emitting diode display 1000 may be provided with the improved durability against the repetitive bending.

Figure 4:
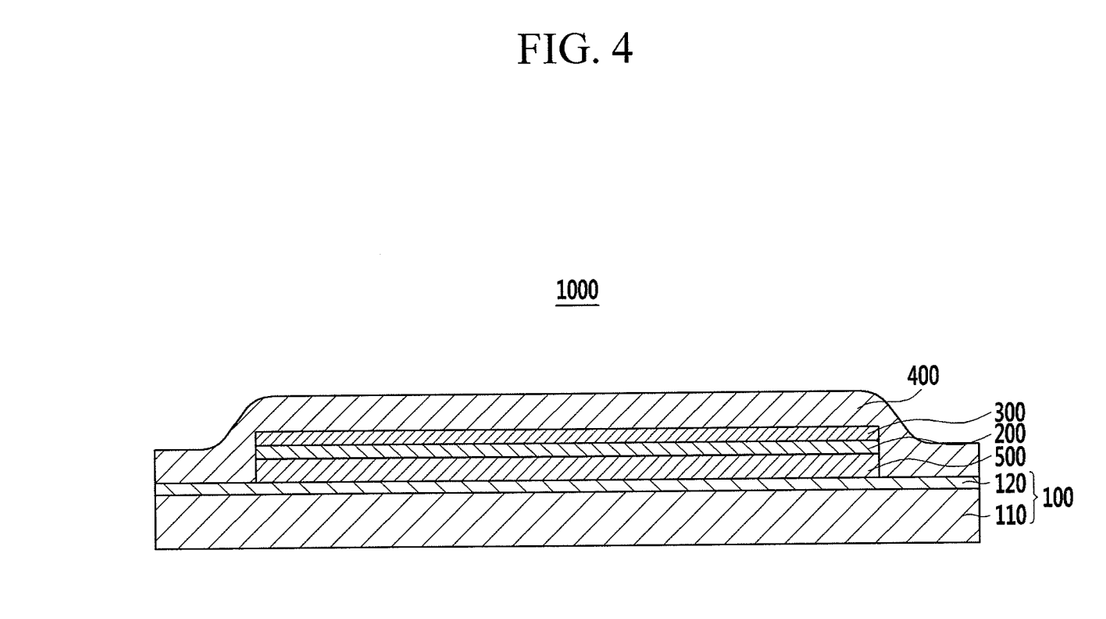
FIG. 4 illustrates a cross-sectional view depicting an organic light emitting diode display according to another exemplary embodiment.

FIG. 4 illustrates a cross-sectional view depicting an organic light emitting diode display according to still another exemplary embodiment. Hereinafter, components different from those of the organic light emitting diode display according to the exemplary embodiment described above will be described.

As illustrated in FIG. 4, the compensation layer 500 of the organic light emitting diode display 1000 according to this embodiment may be positioned between the element layer 300 and the flexible substrate 100, or, for example, between the driving layer 200 and the flexible substrate 100. The compensation layer 500 may contact the driving layer 200 and the flexible substrate 100, respectively. The compensation layer 500 may include at least one of the organic layer and the inorganic layer and may be formed as a laminate which is formed of a plurality of layers. The compensation layer 500 may have a varying thickness depending on the Young's modulus of the compensation layer 500 itself. For example, when a bending moment is generated in the organic light emitting diode display 1000, the compensation layer 500 may have various thicknesses depending on the Young's modulus of a material forming the compensation layer 500 such that the neutral plane is formed at an interface between the thin film encapsulation layer 400 and the element layer 300. When the bending moment is applied to the organic light emitting diode display 1000, the compensation layer 500 may be configured to control a position of the neutral plane that is formed in the organic light emitting diode display 1000.

As described above, when the bending moment is generated in the organic light emitting diode display 1000 according to this embodiment, the position of the neutral plane NP is controlled by the compensation layer 500. Thus, the interface between the element layer 300 and the thin film encapsulation layer 400 may be formed as the neutral plane. When the interface between the element layer 300 and the thin film encapsulation layer 400 is formed as the neutral plane (NP) by the compensation layer 500 and thus the bending moment is generated in the organic light emitting diode display 1000, due to characteristics of the neutral plane (NP), the interface between the element layer 300 and the thin film encapsulation layer 400 may not be increased or reduced and may be bent while keeping an original length, and as a result, even though a stress is repeatedly applied to the organic light emitting diode display 1000 or a stress beyond breaking strength is applied thereto, the thin film encapsulation layer 400 may be prevented from being peeled off from the element layer 300. The flexible organic light emitting diode display 1000 with the improved durability against the repetitive bending is provided.

Figure 5:
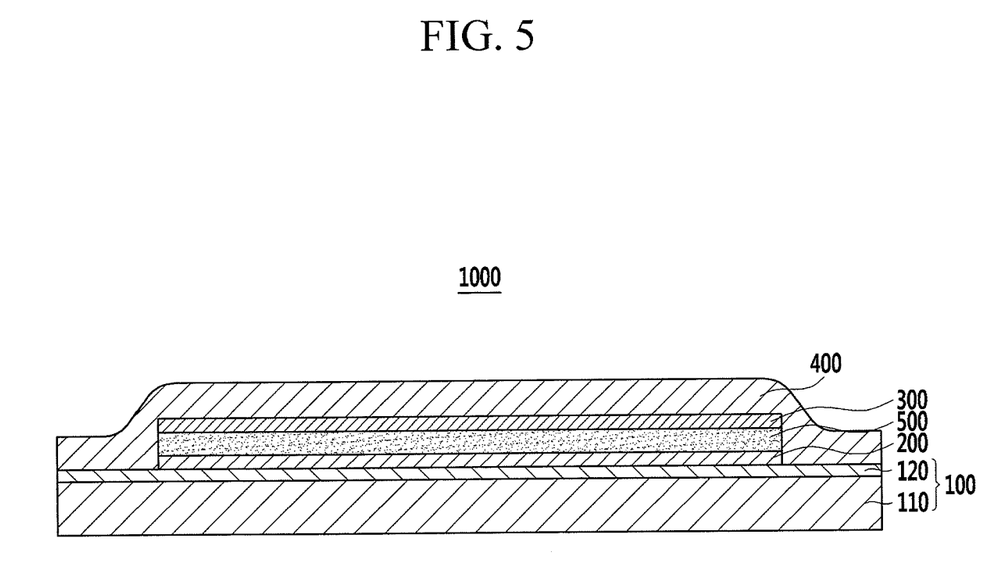
FIG. 5 illustrates a cross-sectional view depicting an organic light emitting diode display according to still another exemplary embodiment.

FIG. 5 illustrates a cross-sectional view illustrating an organic light emitting diode display according to still another exemplary embodiment. Components different from those of the organic light emitting diode display according to the exemplary embodiment described above will be described.

As illustrated in FIG. 5, the compensation layer 500 of the organic light emitting diode display 1000 according to this embodiment may be positioned between the element layer 300 and the flexible substrate 100 and may include a viscoelastic material. The compensation layer 500 may be formed of a suitable material having the viscoelasticity, such as a pressure sensitive adhesive (PSA), or the like.

Figure 6:
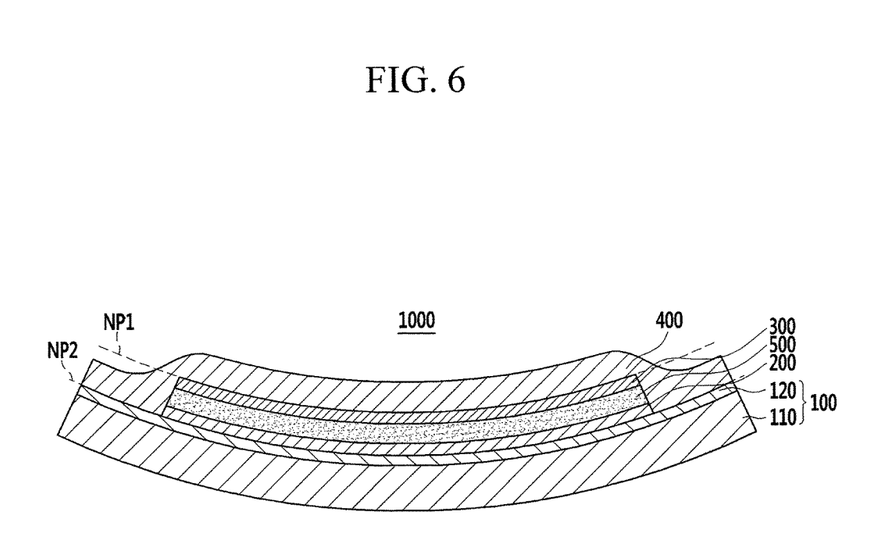
FIG. 6 illustrates a cross-sectional view depicting an example where a bending moment is generated in the organic light emitting diode display illustrated in FIG. 5.

FIG. 6 illustrates a cross-sectional view depicting an example where the bending moment is generated in the organic light emitting diode display illustrated in FIG. 5.

As illustrated in FIG. 6, the organic light emitting diode display 1000 according to this embodiment has the compensation layer 500, which is positioned between the element layer 300 and the flexible substrate 100 and is formed of the viscoelastic material. Thus, when the bending moment is generated in the organic light emitting diode display 1000, due to the characteristics of the viscoelastic material, the compensation layer 500 may be deformed depending on the stress applied to the organic light emitting diode display 1000. As a result, a first neutral plane NP1 may be formed between the thin film encapsulation layer 400 and the compensation layer 500, and at the same time, a second neutral plane NP2 may be formed between the driving layer 200, which is disposed between the compensation layer 500 and the flexible substrate 100. and the flexible substrate 100, such that the stress applied throughout the organic light emitting diode display 1000 may be relaxed.

When the bending moment is generated in the organic light emitting diode display 1000, the compensation layer 500 including the viscoelastic material may be preferentially deformed due to the stress, and thus the neutral planes may be formed at the upper and lower portions of the compensation layer 500, respectively. Thus, the stress applied throughout the organic light emitting diode display 1000 may be relaxed. As a result, even though the stress is repeatedly applied to the organic light emitting diode display 1000 or the stress beyond the breaking strength is applied thereto, a risk that the driving layer 200, the element layer 300, and the thin film encapsulation layer 400 would be broken or separated from one another due to the stress is minimized. The flexible organic light emitting diode display 1000 is provided with improved durability against the repetitive bending.

Figure 7:
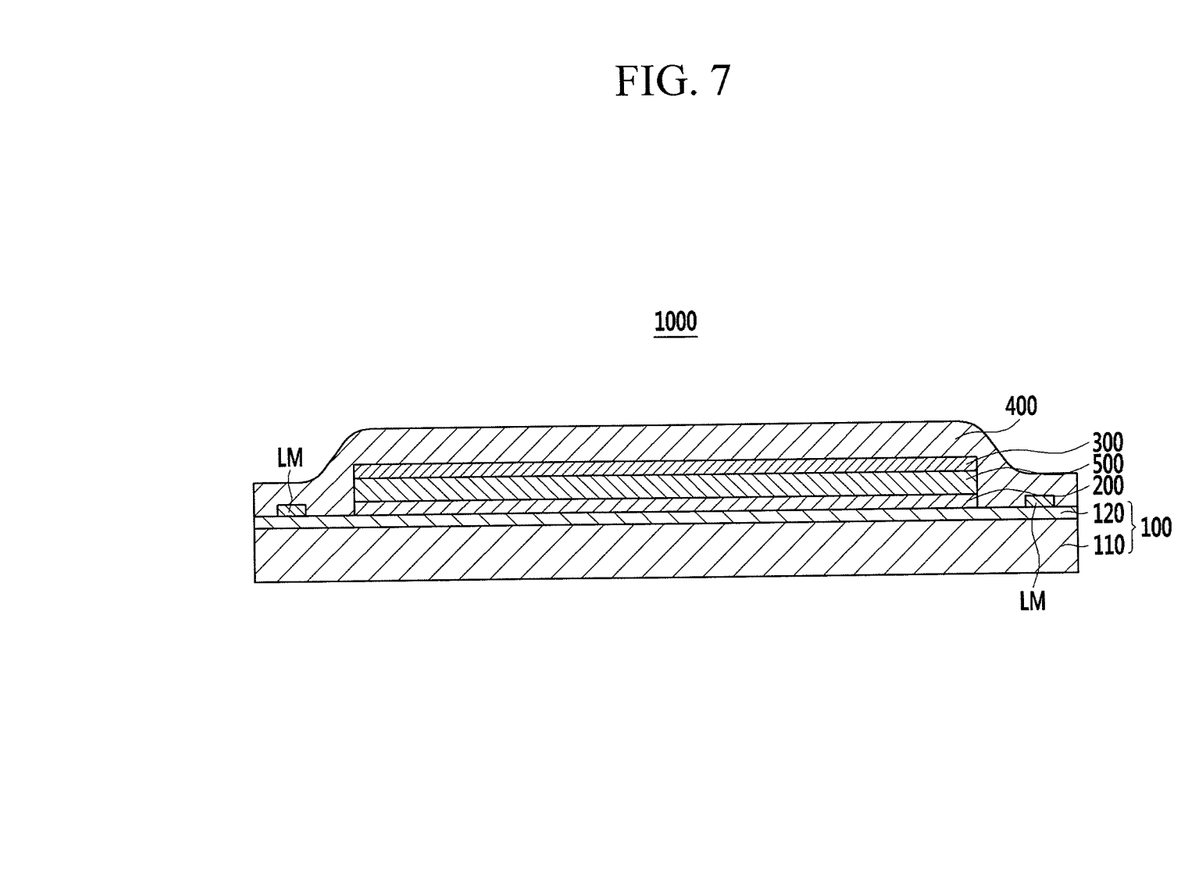
FIG. 7 illustrates a cross-sectional view illustrating an organic light emitting diode display according to still yet another exemplary embodiment.

FIG. 7 illustrates a cross-sectional view illustrating an organic light emitting diode display according to still yet another exemplary embodiment. Components different from those of the organic light emitting diode display according to the exemplary embodiment described above will be described.

As illustrated in FIG. 7, an edge of the thin film encapsulation layer 400 of the organic light emitting diode display 1000 according to this embodiment may contact the flexible substrate 100 and the edge of the thin film encapsulation layer 400. The flexible substrate 100 may be bonded to each other by a laser. The edge of the thin film encapsulation layer 400, which is bonded by the laser, may be provided with a laser bonding part LM. The laser bonding part LM may be formed to enclose the edge of the element layer 300 and may have a closed loop form two-dimensionally.

As such, the organic light emitting diode display 1000 according to this embodiment may include the compensation layer 500 and the laser bonding part LM. Thus when the bending moment is generated, the interface between the element layer 300 and the thin film encapsulation layer 400 may be formed as the neutral plane by the compensation layer 500 in the state in which the edge of the thin film encapsulation layer 400 and the flexible substrate 100 are firmly bonded to each other by the laser bonding. When the bending moment is generated in the organic light emitting diode display 1000, due to characteristics of the neutral plane, the interface between the element layer 300 and the thin film encapsulation layer 400 in the state in which the thin film encapsulation layer 400 is firmly bonded to the flexible substrate 100 may not be increased or reduced and may be bent while keeping an original length. As a result, even if the stress is repeatedly applied to the organic light emitting diode display 1000 or the stress beyond the breaking strength is applied thereto, the thin film encapsulation layer 400 may be prevented from being peeled off from the element layer 300. The flexible organic light emitting diode display 1000 may be provided with improved durability against the repetitive bending.

By way of summation and review, a flexible organic light emitting diode display includes substrate that is formed as a flexible substrate made of a flexible material and the encapsulation that is formed as a thin film encapsulation layer formed of a thin film. The flexible organic light emitting diode display may subject to repeated bending.

Embodiments provide a flexible organic light emitting diode display with improved durability against repetitive bending.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:
1. An organic light emitting diode display, comprising:
 a flexible substrate;
 a driving layer positioned on the flexible substrate and including a thin film transistor;

an element layer positioned on the driving layer and including an organic light emitting diode that is connected to the thin film transistor;

a thin film encapsulation layer covering the element layer and encapsulating the element layer along with the flexible substrate; and a compensation layer positioned between the element layer and the flexible substrate, wherein the organic light emitting diode includes a first electrode connected to the thin film transistor, an organic emission layer on the first electrode, and a second electrode on the organic emission layer, and wherein the compensation layer is disposed between the flexible substrate and the first electrode in a direction orthogonal to a surface of the flexible substrate, the compensation layer includes a viscoelastic material.

2. The organic light emitting diode display as claimed in claim 1, wherein, when a bending moment is generated in the organic light emitting diode display, a first neutral plane is formed between the thin film encapsulation layer and the compensation layer, and a second neutral plane is formed between the compensation layer and the flexible substrate.

3. The organic light emitting diode display as claimed in claim 1, wherein the compensation layer is positioned between the element layer and the driving layer and contacts the element layer and the driving layer, respectively.

4. The organic light emitting diode display as claimed in claim 1, wherein the compensation layer is positioned between the driving layer and the flexible substrate and contacts the driving layer and the flexible substrate, respectively.

5. The organic light emitting diode display as claimed in claim 1, wherein, when a bending moment is generated in the organic light emitting diode display, an interface between the element layer and the thin film encapsulation layer is formed as a neutral plane.

6. The organic light emitting diode display as claimed in claim 1, wherein the flexible substrate includes a substrate main body part including a polymer and a buffer layer positioned on the substrate main body part.

7. The organic light emitting diode display as claimed in claim 1, wherein:

an edge of the thin film encapsulation layer contacts the flexible substrate, and the edge of the thin film encapsulation layer and the flexible substrate are bonded to each other by laser bonding.

8. An organic light emitting diode display, comprising:

a flexible substrate;

a driving layer positioned on the flexible substrate and including a thin film transistor;

an element layer positioned on the driving layer and including an organic light emitting diode that is connected to the thin film transistor;

a thin film encapsulation layer covering the element layer and encapsulating the element layer along with the flexible substrate; and a compensation layer positioned between the element layer and the flexible substrate, wherein the organic light emitting diode includes a first electrode connected to the thin film transistor, an organic emission layer on the first electrode, and a second electrode on the organic emission layer, wherein the compensation layer is disposed between the flexible substrate and the first electrode in a direction orthogonal to a surface of the flexible substrate, the compensation layer includes a viscoelastic material, and wherein, when a bending moment is generated in the organic light emitting diode display, an interface between the element layer and the thin film encapsulation layer is formed as a neutral plane.

* * * * *